FABRICATION OF A METAL BASE TRANSISTOR

Filed Oct. 24, 1965 4 Sheets-Sheet 1

INVENTORS
GENE R. HENDRICKSON
DON W. SHAW
EDWARD W. MEHAL
BY

ATTORNEY 3,322,581
FABRICATION OF A METAL BASE TRANSISTOR

Gene R. Hendrickson, Richardson, Don W. Shaw, Garland, and Edward W. Mehal, Dallas, Tex., assignors to Texas Instruments Incorporated, Dallas, Tex., a corporation of Delaware Filed Oct. 24, 1965, Ser. No. 504,534
6 Claims. (Cl. 148—175)

This invention relates to semiconductor devices, and more particularly to a method for manufacturing a metal base transistor.

It has been recognized that a metal base transistor has several theoretical advantages over any other transistor-type, current-controlled device. For example, it has been shown that the ultimate theoretical value of the alpha cut-off frequency $f_a$ would be on the order of $2\times10^{10}$ c.p.s. and the maximum frequency of oscillation $f_{max}$ would be on the order of $1\times10^{11}$ c.p.s. In both cases, the values are a factor of two better than the corresponding values which could be theoretically expected from any other transistor-type, current-controlled device.

The metal base transistor also has a low input impedance, a high output impedance, a current gain which is essentially independent of current level, and a low feedback factor. Stable base conditions are established by the input (emitter) current and output (collector) voltage. Input voltage is considered a dependent variable determined uniquely by the input current. In the common base configuration, power gain is realized in these devices by virtue of the ratio of output to input impedance. The normally preferred common emitter configuration provides both current and voltage gain.

The high frequency limit, $f_a$, of the metal base transistor is determined by the relaxation time of the emitter base structure together with the collector transit time. For hot electron transport across the thin metallic base layer in this type of device, the base transit time, approximately $10^{-12}$ seconds, is negligible. The extremely low base spreading resistance offered by the metallic base layer also reduces the internal feedback factor and increases the Q at the output terminals in contrast with a conventional transistor. These effects combine to produce useful power gain at frequencies significantly higher than $f_a$.

A thin film metal base transistor also offers the possibility of performing satisfactorily under conditions known to be detrimental to semiconductor minority carrier devices. For example, the metal base transistor should be relatively immune from radiation effects due to the majority carrier aspects of the device because degradation of minority carrier lifetime is not a concern under these conditions. This factor is important in considering the design of electronic systems for nuclear reactors or space applications where components are subject to radiation fields.

As is well known in the art, it is virtually essential that the semiconducting regions of a transistor or other semiconductor device be of single crystal structure. Therefore, perhaps the most significant problem in the manufacture of a metal base transistor, particularly of the thin film type, lies in producing the single crystal structure on each side of the metal film forming the transistor base. One method of obtaining such a result would be the epitaxial deposition of the metallic film on a single crystal active semiconductor material, and then the epitaxial deposition of the second semiconductor layer directly upon the metal film. However, at the present time, we do not know of a metal having the proper crystal structure (single crystal) for epitaxial deposition directly thereupon which also has the necessary electrical, physical and chemical properties for the base region. Further, it is considered unnecessary for the operation of the metal base transistor for the metal base to be of single crystal construction so that the added difficulty and expense of depositing such a layer is unwarranted if another suitable approach is available.

It is, therefore, the object of the present invention to fabricate a metal base transistor by a novel process which does not require the epitaxial deposition of monocrystalline semiconductor material directly upon the metal base region.

It is another object of the invention to fabricate a metal base transistor by a process which allows the thin metal region to be of a dissimilar crystal structure than that of the adjacent semiconductor regions.

In accordance with these and other objects, the present invention involves the fabrication of a metal base transistor by a process which comprises forming a hole or pocket within a single crystalline semiconductor substrate (which may form the collector) selectively locating a metal layer at the bottom of the pocket, and epitaxially growing another single crystalline semiconductor region to fill the pocket, the epitaxial growth proceeding from the exposed single crystalline walls of the pocket and extending laterally over the metal layer to form the emitter region. In the present specification and appended claims, the term epitaxial growth or deposition means the oriented growth of a single crystal upon a single crystal of either identical or similar crystal structure. A portion of this emitter layer is then selectively removed to expose a portion of the metal base layer, and allow external contact to be made thereto.

Since the epitaxial growth of the emitter region does not require the growth of semiconductor material directly upon the metal base region, this latter region may have an amorphous or dissimilar crystal structure.

The novel features believed characteristic of this invention are set forth in the appended claims. The invention itself, however, as well as other objects, features, and advantages thereof, may best be understood by reference to the following detailed description of illustrative embodiments taken in conjunction with the accompanying drawings, wherein:

Figures 1, 2:
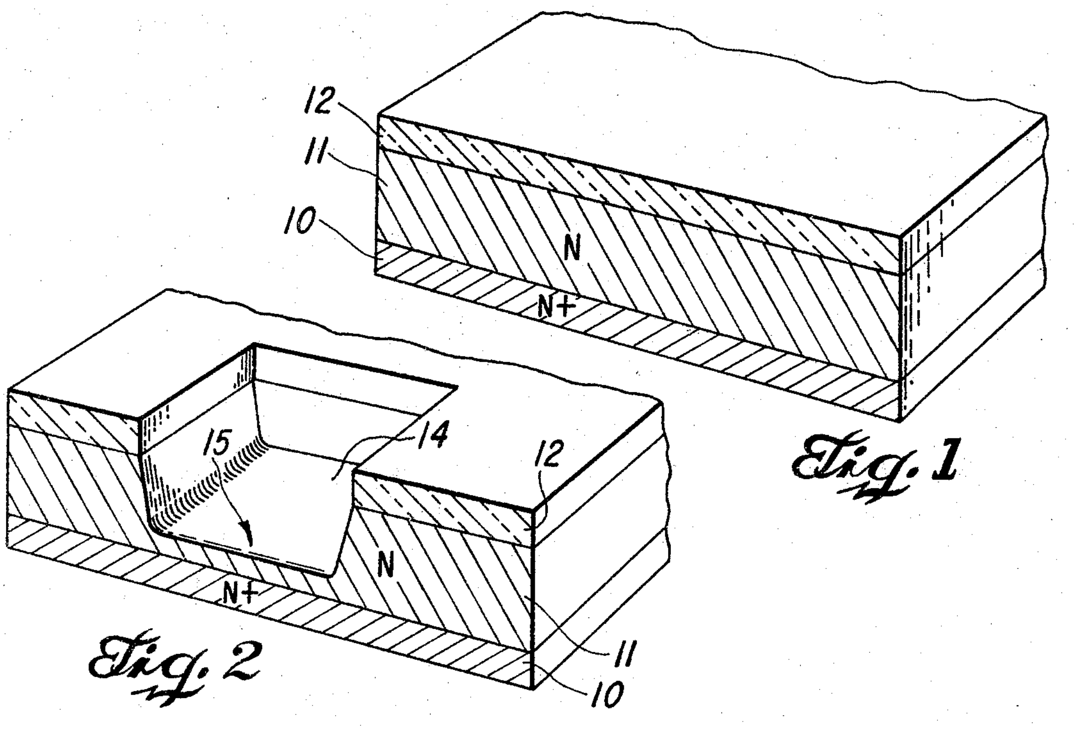
FIGURES 1–6 are pictorial views in section, showing subsequent steps in the fabrication of one embodiment of the present invention.

The drawings are not necessarily to scale as dimensions of certain parts as shown in the drawings have been modified and/or exaggerated for the purpose of clarity of illustration.

Referring to FIGURE 1, there is now described the first step in the fabrication of a metal base transistor according to the process of this invention. A substrate 10 of single crystal low resistivity N+ semiconductor material having a resistivity perhaps $10^{-4}$ to $10^{-2}$ ohm-cm. is used as the starting material. Upon this substrate 10 there is formed, by suitable epitaxial techniques for example, a layer 11 of high resistivity N-type semiconductor material having a resisitivity of perhaps $10^{-2}$ to $10^{2}$ ohm-cm. A layer 12 of silicon oxide, for example, is then formed upon the layer 11. The formation of the silicon oxide layer may be achieved by various techniques. For example, when the layer 11 of semiconductor material is silicon, it may be thermally grown by heating the substrate to a temperature of approximately 1300° C. in the presence of oxygen or steam. An alternate process, one which particularly may be used when the substrate 11 is of another semiconductor material besides silicon, is the pyrolytic decomposition of the siloxanes, such as $Si(OC_2H_5)_4$, whereby the silicon oxide layer 12 is deposited rather than grown upon the semiconductor substrate 11.

Through the use of conventional photographic masking and etching techniques, for example, a select portion of the oxide layer 12 is removed, as shown in FIGURE 2, to form the aperture or window 14. This removal may be accomplished by covering the oxide layer 12 with photoresist, masking the photoresist except for a region corresponding to an area of the window 14, exposing and developing the photoresist, and etching away the unmasked area of the oxide. By this method, an oxide mask is produced directly on the surface of the subtrate 11. The mask thus produced limits the area of the substrate that is to be affected by the subsequent selective etch and epitaxial redeposition.

As the next step in the process of the present invention, the substrate 11 is subjected to a selective etch which removes a given amount of semiconductor material beneath the window 14. This removal may be accomplished by a conventional solution etch, or alternatively by a conventional vapor etch, the etchant being of a composition which removes the exposed semiconductor material beneath the window 14 while substantially unaffecting the oxide mask 12. Consequently, a "pocket" 15 is formed, as shown in FIGURE 2. (The sides of the "pocket" are depicted as slanted due to the lateral etching and undercutting of the oxide 12 that ordinarily occurs during the selective etching step.)

As the next step, a layer 16 of metal is selectively located at the bottom of the pocket 15 beneath the window 14. This may be accomplished, for example, by evaporating or sputtering a metal film over the top surface of the oxide mask and upon the semiconductor body 11 within the pocket 15, the metal film forming along the walls and the bottom of the pocket 15. Then, using conventional photographic masking and etching techniques, the metal is selectively removed from the oxide layer 12 and from the walls of the pocket 15 so that the only metal that remains within the pocket 15 is that portion or layer 16 which covers the bottom of the pocket, as illustrated in FIGURE 3.

Figures 3, 4:
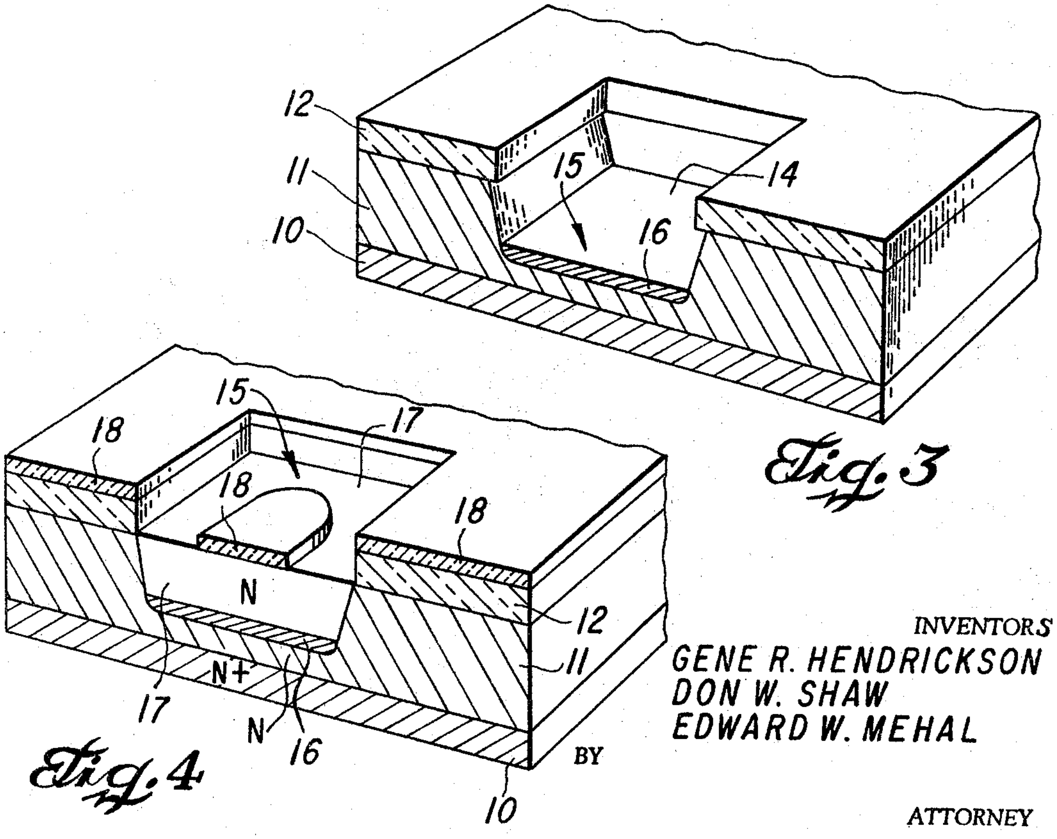

There is then selectively epitaxially redeposited or grown within the pocket 15 a region 17 of single crystalline N-type semiconductor material as depicted in FIGURE 4. Due to the fact that the walls of the pocket 15 are exposed, single crystalline semiconductor material will grow within the pocket 15 over the metal layer 16 even though the metal layer 16 is present on the bottom of the hole, the epitaxial growth proceeding from the walls inward. (Although FIGURE 4 depicts the grown region 17 as having walls intersecting each other at well defined angles, in actuality the epitaxially redeposited region 17 will be somewhat cylindrical in shape due to the epitaxial growth from the corners of the pocket 15.) A second oxide layer is then formed over the oxide mask 12 and the N-type semiconductor region 17, and selectively removed by conventional photographic masking and etching techniques, resulting in the masked structure 18 shown in FIGURE 4.

Figures 5, 6:
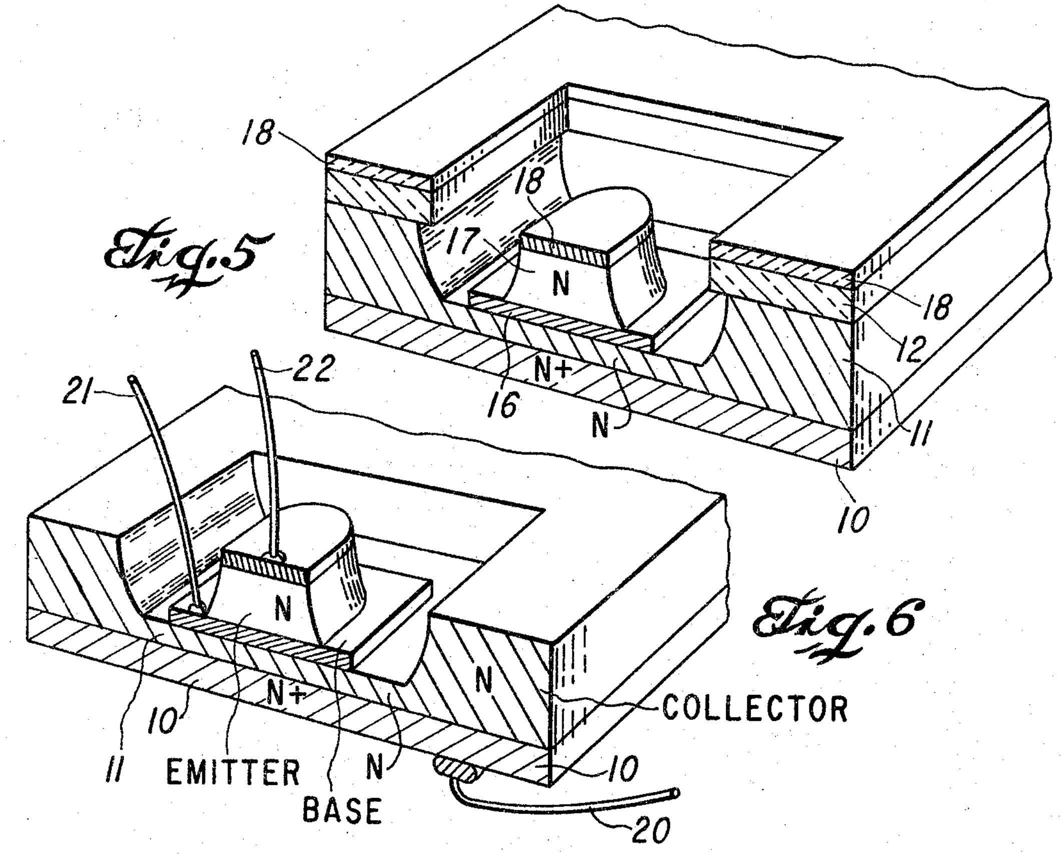

The unmasked exposed semiconductor material of the region 17 is then subjected to an etchant which selectively removes this material while substantially unaffecting the oxide mask 18 and the metal layer 16, resulting in the structure shown in FIGURE 5.

The oxide layers 12 and 18 are then removed by selective etching, and the external leads 20, 21 and 22 are attached by ball-bonding, for example, to the collector, metal base, and emitter regions, respectively. The low resistivity N+ layer 10 allows the external lead 20 to make low resistance contact to the collector region by the external lead 20.

Various semiconductor materials may be used for the emitter and collector regions, and the emitter and collector need not be of the same semiconductor material. It is desirable, however, to use a semiconductor material which has a high band gap in order to provide good emission efficiency at high temperatures, and one which may be epitaxially grown at low temperatures in order to minimize inter-diffusion of the metal and semiconductor films, and also to minimize surface migration of the atoms in the metal film and their coalescence into islands. In line with these considerations, gallium arsenide semiconductor material is particularly suitable. Germanium semiconductor material may be epitaxially deposited at low temperatures, but it has too low a band gap for best emission efficiency. Silicon can also be used for the active regions and offers a better band gap than germanium but ordinarily requires high temperatures for epitaxial deposition. In contrast, gallium arsenide has a band gap higher than silicon, namely, 1.42 ev. at room temperature, and requires substrate temperatures of only about 750° C. for epitaxial deposition. When gallium arsenide is used as the semiconductor material, a $Br_2$-methanol mixture may be used for the selective etching step described above with reference to FIGURE 2, when the etch is a solution etch, and $HBr+H_2$ when the etch is a vapor etch.

To minimize electron-phonon collisions and electron-electron collisions within the metal base region 16, thereby increasing the efficiency of the metal base transistor, it is preferable to form the metallic layer 16 as thin as possible (no thicker than 100 or 200 A. and preferably thinner), provided the layer is not discontinuous, its sheet resistance not excessive, and it is closely bonded to the semiconductor regions. A wide range of metals can be used to form the thin metallic layer 16 between the semiconducting layers 11 and 17. This is permitted because the metal layer need not be single crystalline due to the process of the invention, and may be amorphous or polycrystalline. However, the particular metal used for the metallic layer should be chosen with the following characteristics in mind: (1) relatively long electron-electron mean free path; (2) melting point above that ordinarily reached during processing, especially during the epitaxial growth step; (3) ease of deposition; (4) physical and chemical durability; (5) solubility and diffusion in materials used for semiconductor regions adjacent the metallic layer; and (6) ease of surface cleaning prior to epitaxial deposition of the N-type semiconductor region 17. As particular examples, the elements gold or molybdenum have been found to be favorable for use as the thin metallic layer.

The deposition of molybdenum, for example, as the metallic layer 16 may be accomplished by evaporation or sputtering, the excess molybdenum being selectively removed by an etchant composed of a solution of acetic, nitric, and phosphoric acid, for example.

The epitaxial deposition of the N-type semiconductor layer 17 shown in FIGURE 4 is accomplished by a technique which causes preferential growth only upon the exposed semiconductor walls within the pocket 15 shown in FIGURE 3 due to the crystal propogation of this exposed semiconductor material. One such technique is described with reference to FIGURE 7 wherein apparatus suitable for the epitaxial growth of gallium arsenide as the region 17 is shown. The apparatus comprises an elongated quartz reaction vessel 30 having two inlets 31 and 32 and an exhaust 33. A constriction 34 is provided within the vessel 30 which contains a given amount of material 35 of high purity gallium or gallium arsenide. The constriction 34 is so constructed as to cause gas entering through inlet 31 to contact the material 35 as it flows out of the constriction through opening 34*a*, and into the reaction vessel cavity. The reaction vessel 30 is positioned within an appropriate furnace having two separately controlled temperature zones shown at 52 and 53, the zone 52 being maintained at a higher temperature than the zone 53.

A liquid halide 50 of arsenic, for example $AsCl_3$, is contained within a closed vessel, or bubbler 44. The bubbler is only partially filled to leave a vapor-containing space above the liquid. A temperature controlling device 56 is disposed about the bubbler 44 to provide additional control over the amount of $AsCl_3$ admitted into the reaction vessel 30.

Figure 7:
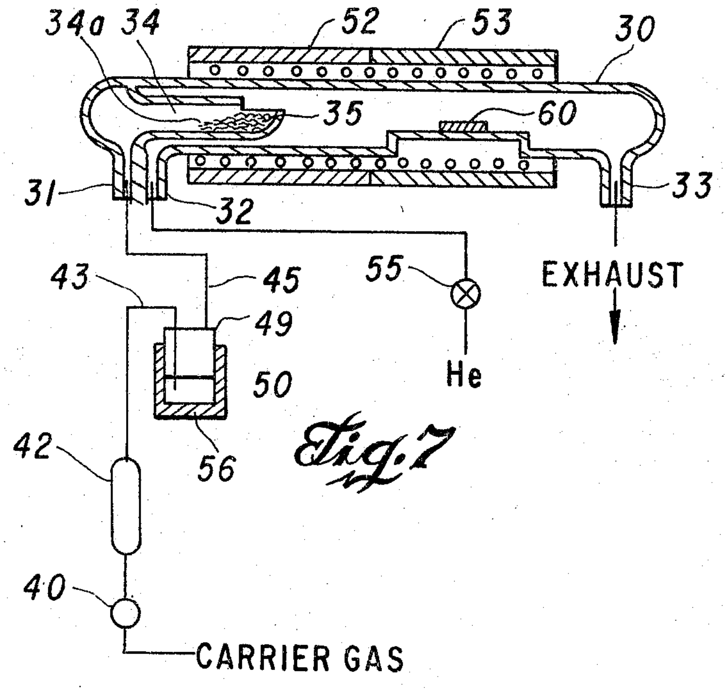
FIGURE 7 is a front elevation, partially in section, showing one form of apparatus utilized in the fabrication of the present invention.

The composite structure of FIGURE 3 where the semiconductor layer 11 is of gallium arsenide, is placed in the reaction vessel 30, as shown in FIGURE 7 (where the composite structure is represented as the body 60). The reaction vessel is then flushed with dry helium, admitted through the valve 55, in order to flush atmospheric gases such as oxygen and water vapor from the reaction vessel. The individually controlled furnace zones 52 and 53 are activated to raise the temperature of the material 35 and the body 60 to approximately 900° C. and 750° C., respectively.

A carrier gas, for example hydrogen, is admitted to the apparatus through a valve 40, the gas passing through a flowmeter 42 and tube 43, the tube 43 having its open end submerged in the liquid $AsCl_3$. The liquid $AsCl_3$ in the bubbler 44 is maintained at room temperature. The gas passing through the tube 43 is admitted below the surface of the liquid 50 and near the bottom of the bubbler 44. Gas so admitted rises to the surface of the liquid in small bubbles and thus becomes saturated with vapor of the liquid $AsCl_3$. The saturated gas leaves the bubbler 44 by way of an exit tube 45 feeding into the reaction vessel 30 through the inlet 31, and passes over the gallium or gallium arsenide material 35 within the constriction 34. When the material 35 is gallium, the reaction of the gas with the gallium might be $$4\ AsCl_{3(g)} + 12\ Ga_{(l)} \xrightarrow[H_2]{900^\circ\ C.} 12\ GaCl_{(g)} + As_{4(g)}$$

or in the case of the material 35 being gallium arsenide;

$$AsCl_{3(g)} + 3\ GaAs_{(s)} \xrightarrow[H_2]{900^\circ\ C.} 3\ GaCl_{(g)} + As_{4(g)}$$

The resultant gases are then swept into the reaction vessel cavity over the substrate 60 where the following disproportionation reaction at the low temperature occurs:

$$3\ GaCl_{(g)} \xrightarrow[H_2]{750^\circ\ C.} 2\ Ga_{(g)} + GaCl_{3(g)}$$

Formation of GaAs then results from the equation:

$$4\ Ga_{(g)} + As_{4(g)} \xrightarrow[H_2]{750^\circ\ C.} 4\ GaAs_{(s)}$$

N-type doping may be achieved, for example, by adding $H_2S$ to the carrier gas, or impurities such as tin and tellurium may be included in the feed material 35, or may be included in suitable form in the halide solution 50. Using the above described process, when the hydrogen carrier gas is passed through the bubbler 44 at a rate of approximately 100 $cm.^3$/minute, the N-type gallium arsenide layer 17 grows at a rate of approximately 15 microns per hour.

Figure 8:
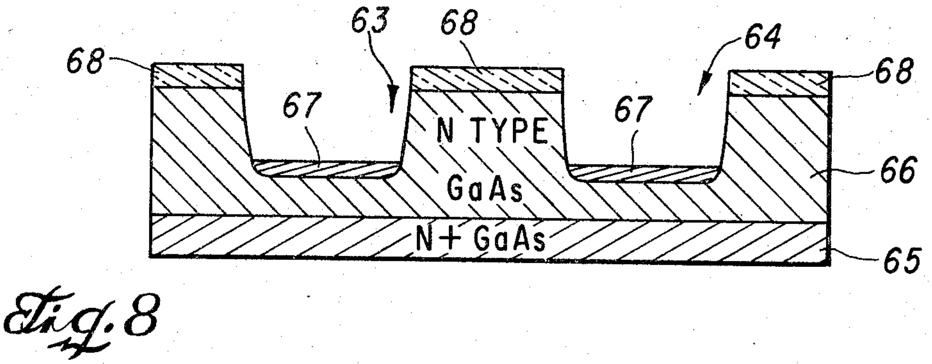
FIGURES 8–13 are sectional views showing subsequent steps in the fabrication of another embodiment of the present invention.
Figure 9:
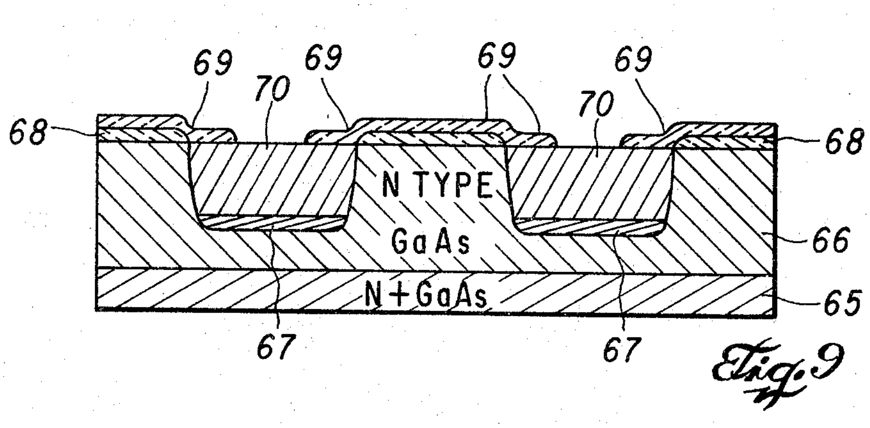
Figure 10:
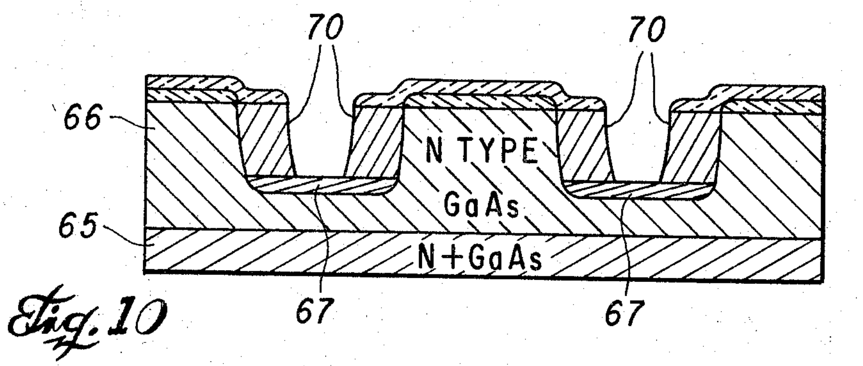

Referring now to FIGURES 8–13 there is described the fabrication of another embodiment of the present invention. Accordingly, the identical process steps described with reference to FIGURES 1–3 are carried out, resulting in the structure of FIGURE 8 wherein a body 66 of N-type gallium arsenide, is formed adjacent a layer 65 of low resistivity N+ gallium arsenide, the body 66 having pockets 63 and 64 formed therein. As before, layers 67 of metal are selectively located at the bottom or base of the pockets 63 and 64. An oxide mask 68 is located upon the top surface of the body 66 as shown in FIGURE 8.

As the next step in the process, regions 70 of semi-insulating semiconductor material, for example chromium or iron doped gallium arsenide, are selectively grown within the pockets 63 and 64, the epitaxial growth proceeding from the walls of the pockets 63 and 64 laterally over the metal layers 67. By semi-insulating is meant semiconductor material that exhibits a resistivity in excess of $10^4$ ohm-cm. An oxide layer 69 is then formed over the entire structure and selectively removed by conventional photographic and etching techniques, resulting in the oxide masked structure shown in FIGURE 9, wherein select portions of the semi-insulating regions 70 remain unmasked and exposed. An etchant is applied which selectively removes these exposed portions while substantially unaffecting the oxide layers 68 and 69 and the metal layers 67, resulting in the structure shown in FIGURE 10. When the semi-insulating regions 70 are of gallium arsenide semiconductor material, and the metal layers 67 are of molybdenum a suitable etchant may be sodium hypochlorite (NaOCl).

Figure 11:
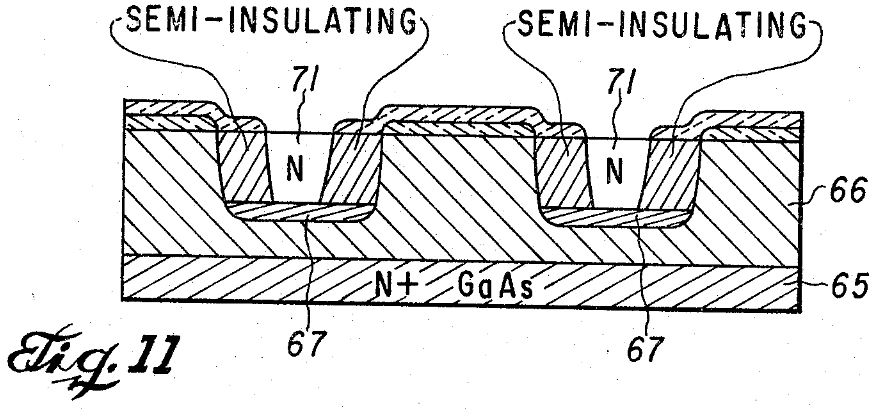

N-type semiconductor regions 71 are then selectively epitaxially redeposited within the previously etched holes or pockets, the epitaxial growth again proceeding from the walls of the unremoved semi-insulating portions to completely fill up the holes or pockets over the metal layer 67, as shown in FIGURE 11.

Figure 12:
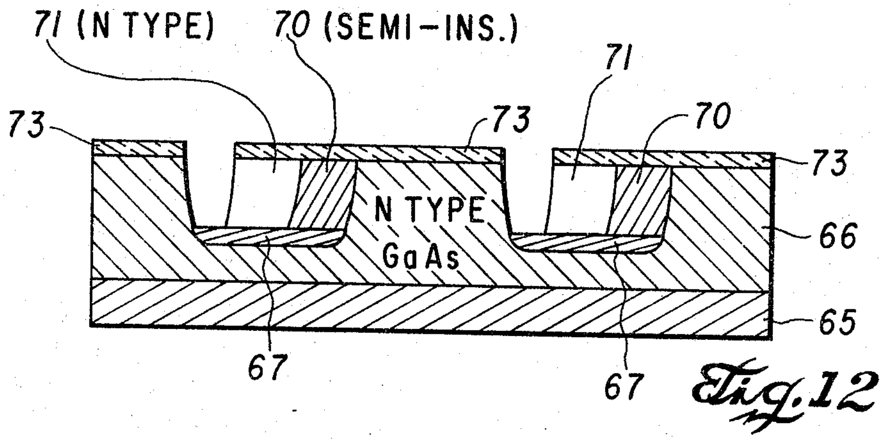
Figure 13:
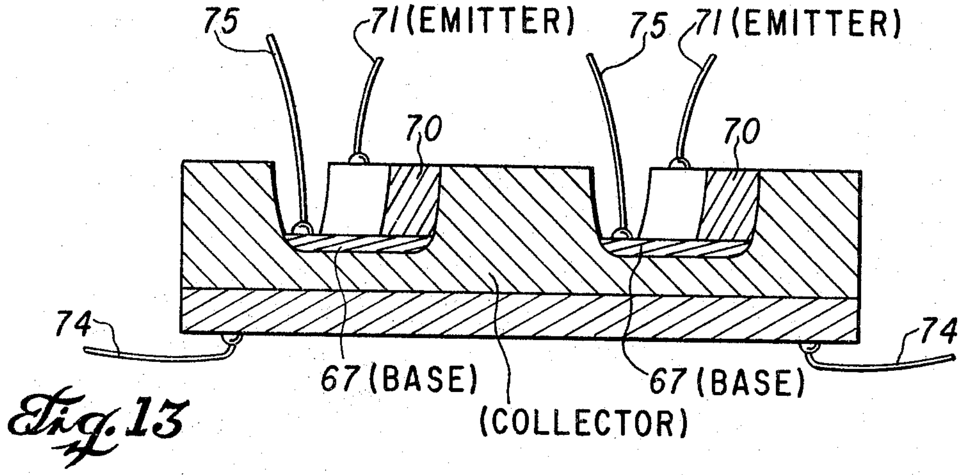

Referring now to FIGURE 12, an oxide mask 73 is selectively formed upon the top surface of the structure, and portions of semiconductor material above the metal layer 67 are removed by selective etching, thereby exposing portions of the metal layers 67. The oxide mask 73 is then removed, the units separated, and the external leads 74, 75, and 76 are attached by ball bonding, for example, to the collector, metal base, and emitter regions, respectively. Alternatively, instead of separating the metal base transistors into discrete devices, they may remain one continuous body, and have application in an integrated circuit.

As an alternative to forming the regions 70 of semi-insulating material, this region may also be formed of P-type semiconductor material, the junction between the regions 70 and 71 then providing an isolation barrier. This step may be particularly desirable when material other than gallium arsenide semiconductor material, for example silicon or germanium, is used in fabricating the transistor. This is so because the high resistivity associated with semi-insulating gallium arsenide ($10^4$ ohm-cm. or more) is ordinarily not obtainable with semi-insulating or intrinsic silicon and germanium.

Although the step of epitaxial growth has been described with reference to masking only the bottom of the pockets with a metal layer, the epitaxial regrowth then proceeding from all of the walls inward, the same results may be achieved when one or more of the walls of the pockets are covered with the thin metal film for as long as at least one wall remain exposed, the growth occurs from this one wall. In addition it may be desirable, prior to this epitaxial growth, to thoroughly clean the metal base layer to assure that no nucleation or growth occurs upon this metal layer.

While the invention has been described with reference to specific methods and embodiments, it is to be understood that this description is not to be construed in a limiting sense. There are modifications of the disclosed embodiments, as well as other embodiments of the invention that may become apparent to persons skilled in the art without departing from the spirit and scope of the invention as defined by the appended claims.

What is claimed is:

1. In a method of making a semiconductor device, the steps of:

(a) selectively removing a portion of a single crystalline semiconductor body to form a pocket therein, (b) selectively locating a metal layer to cover the bottom of said pocket, the walls of said pocket remaining exposed single crystalline semiconductor material, and (c) epitaxially growing a region of single crystalline semiconductor material over said metal layer within said pocket, said epitaxial growth proceeding from the exposed single crystalline walls of the said pocket and extending substantially laterally over the metal layer.

2. In a method of making a metal base transistor, the steps of:
(a) selectively removing a portion of an N type single crystalline semiconductor body to form a pocket therein,
(b) selectively locating a metal layer to cover the bottom of said pocket, the walls of said pocket remaining exposed single crystalline semiconductor material,
(c) epitaxially growing a region of N type single crystalline semiconductor material over said metal layer within said pocket, said epitaxial growth proceeding from the exposed single crystalline walls of the said pocket and extending substantially laterally over the metal layer, and
(d) selectively removing portions of said N type region to expose a portion of said metal layer and to electrically isolate said N type region from said N type body.

3. In a method of making a metal base transistor, the steps of:
(a) selectively removing a portion of an N type single crystalline semiconductor body to form a pocket therein,
(b) selectively locating a metal layer to cover the bottom of said pocket, the walls of said pocket remaining exposed single crystalline semiconductor material,
(c) epitaxially growing a region of N type single crystalline semiconductor material over said metal layer within said pocket, said epitaxial growth proceeding from the exposed single crystalline walls of the said pocket and extending substantially laterally over the metal layer,
(d) selectively removing portions of said N type region to expose a portion of said metal layer and to electrically isolate said N type region from said N type body, and
(e) forming individual external leads to said N type body, said metal layer, and said N type region.

4. In a method of making a metal base transistor, the steps of:
(a) selectively removing a portion of an N type single crystalline semiconductor body to form a pocket therein,
(b) forming a metal film within said pocket,
(c) selectively removing said metal film to leave a layer solely at the bottom of said pocket, the walls of said pocket remaining exposed single crystalline semiconductor material,
(d) epitaxially growing a region of N type single crystalline semiconductor material over said metal layer within said pocket, said epitaxial growth proceeding from the exposed single crystalline walls of the said pocket and extending substantially laterally over the metal layer,
(e) selectively removing portions of said N type region to expose a portion of said metal layer and to electrically isolate said N type region from said N type body, and
(f) forming individual external leads to said N type body, said metal layer, and said N type region.

5. In a method of making a metal base transistor, the steps of:

(a) forming a body of N type single crystalline semiconductor material adjacent a layer of N+ type material,
(b) selectively removing a portion of said N type body to form a pocket therein,
(c) forming a metal film within said pocket,
(d) selectively removing said metal film to leave a metal layer solely at the bottom of said pocket, the walls of said pocket remaining exposed single crystalline semiconductor material,
(e) epitaxially growing a region of N type single crystalline semiconductor material over said metal layer within said pocket, said epitaxial growth proceeding from the exposed single crystalline walls of the said pocket and extending substantially laterally over the metal layer,
(f) forming individual external leads to said N type body, said metal layer, and said N type region, and
(g) forming individual external leads to said N+ layer, said metal layer, and said N type region.

6. A method of making a metal base transistor, comprising the steps of:
(a) selectively removing a portion of an N type single crystalline semiconductor body to form a pocket therein,
(b) selectively locating a metal layer to cover the bottom of said pocket, the walls of said pocket remaining exposed single crystalline semiconductor material,
(c) epitaxially growing a region of single crystalline semi-insulating semiconductor material over said metal layer within said pocket, said epitaxial growth proceeding from the exposed single crystalline walls of the said pocket and extending substantially laterally over the metal layer,
(d) selectively removing a portion of said semi-insulating region to expose the top surface of said metal layer, and
(e) epitaxially growing a region of N type single crystalline semiconductor material over said exposed top surface of said metal layer, the growth proceeding from the exposed single crystalline walls of the semi-insulating region, and extending substantially laterally over the said top surface of said metal layer.

References Cited

UNITED STATES PATENTS

| | | | |
|---|---|---|---|
| 2,854,366 | 9/1958 | Wannlund et al. | 148—33.2 |
| 2,921,362 | 1/1960 | Nomura | 148—33.2 |
| 3,000,768 | 9/1961 | Marinace | 148—175 |
| 3,083,441 | 4/1963 | Little et al. | 148—189 |
| 3,171,762 | 3/1965 | Rutz | 148—175 |
| 3,193,418 | 7/1965 | Cooper et al. | 11—174 |
| 3,243,323 | 3/1966 | Corrigan et al. | 11—175 |
| 3,278,347 | 10/1966 | Topas | 148—33.2 |

OTHER REFERENCES

I.B.M. Technical Disclosure Bulletin, vol. 3, No. 8, January 1961, pp. 29–30.

I.B.M. Technical Disclosure Bulletin, vol. 4, No. 10, March 1962, p. 49.

DAVID L. RECK, *Primary Examiner.*

N. F. MARKVA, *Assistant Examiner.*